(12) United States Patent
Sakuma

(10) Patent No.: US 11,257,968 B2
(45) Date of Patent: Feb. 22, 2022

(54) METHOD OF MANUFACTURING SOLAR CELL AND SPLITTABLE SOLAR CELL FOR MANUFACTURING SOLAR CELL FROM SPLITTABLE SOLAR CELL THAT CAN BE SPLIT

(71) Applicant: PANASONIC CORPORATION, Osaka (JP)

(72) Inventor: Toshiyuki Sakuma, Osaka (JP)

(73) Assignee: PANASONIC CORPORATION, Osaka (JP)

(*) Notice: Subject to any disclaimer, the term of this patent is extended or adjusted under 35 U.S.C. 154(b) by 0 days.

(21) Appl. No.: 16/831,537

(22) Filed: Mar. 26, 2020

(65) Prior Publication Data

US 2020/0313011 A1    Oct. 1, 2020

(30) Foreign Application Priority Data

Mar. 27, 2019 (JP) .............................. JP2019-061114

(51) Int. Cl.
| | |
|---|---|
| H01L 31/20 | (2006.01) |
| H01L 31/0352 | (2006.01) |
| H01L 31/0224 | (2006.01) |
| H01L 31/0747 | (2012.01) |
| H01L 31/18 | (2006.01) |
| H01L 31/0236 | (2006.01) |

(52) U.S. Cl.
CPC ............. *H01L 31/035281* (2013.01); *H01L 31/02363* (2013.01); *H01L 31/022475* (2013.01); *H01L 31/0747* (2013.01); *H01L 31/1884* (2013.01); *H01L 31/202* (2013.01)

(58) Field of Classification Search
CPC ......... H01L 31/1884; H01L 31/035281; H01L 31/022475; H01L 31/202; H01L 31/0747; H01L 31/02363; H01L 31/022466; H01L 31/042; H01L 31/046; H01L 31/022425; H01L 31/1804; Y02E 10/50
See application file for complete search history.

(56) References Cited

U.S. PATENT DOCUMENTS

| | | | |
|---|---|---|---|
| 5,391,235 A * | 2/1995 | Inoue ................. | H01L 31/03921 136/244 |
| 8,134,217 B2 * | 3/2012 | Rim .................... | H01L 31/0682 257/431 |
| 2008/0029154 A1 * | 2/2008 | Milshtein ............ | H01L 31/0463 136/256 |

(Continued)

FOREIGN PATENT DOCUMENTS

| | | | | |
|---|---|---|---|---|
| JP | 2014-239085 A | 12/2014 | | |
| WO | WO-2011093329 A1 * | 8/2011 | ......... | H01L 31/0747 |
| WO | WO-2018084159 A1 * | 5/2018 | ........... | H01L 31/028 |

*Primary Examiner* — Earl N Taylor
(74) *Attorney, Agent, or Firm* — McDermott Will & Emery LLP

(57) ABSTRACT

In a method of manufacturing a solar cell, a groove is formed on a first surface of an n-type semiconductor substrate. A p-side transparent conductive film layer is formed on the first surface of the n-type semiconductor substrate formed with the groove. A non-deposition area, where the p-side transparent conductive film layer is not formed, is formed in at least a part of a side surface of the groove formed on the first surface of the n-type semiconductor substrate.

5 Claims, 4 Drawing Sheets

(56) References Cited

U.S. PATENT DOCUMENTS

| | | | |
|---|---|---|---|
| 2012/0298175 A1* | 11/2012 | Van Roosmalen | ........................... H01L 31/0475 136/244 |
| 2015/0270422 A1* | 9/2015 | Uzu | .................... H01L 31/0463 136/256 |
| 2019/0259885 A1* | 8/2019 | Yoshikawa | ....... H01L 31/02167 |
| 2020/0313011 A1* | 10/2020 | Sakuma | .......... H01L 31/022466 |

* cited by examiner

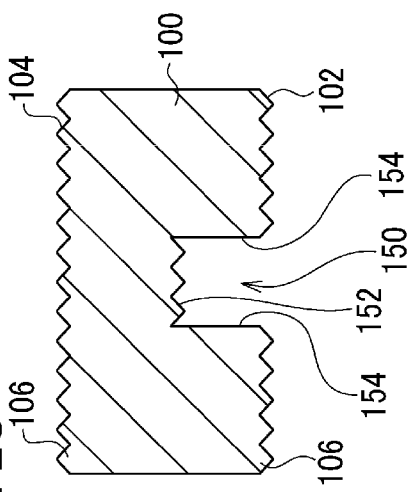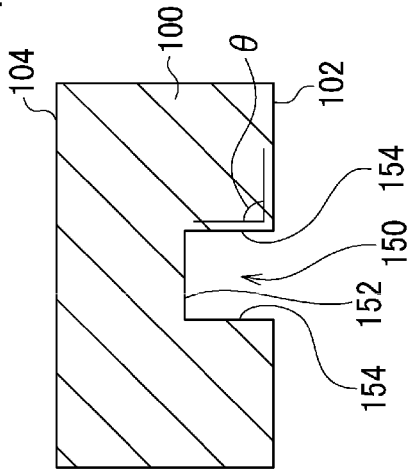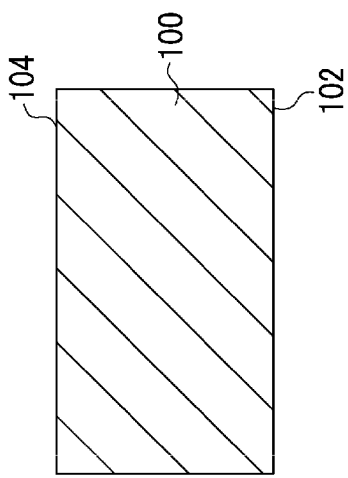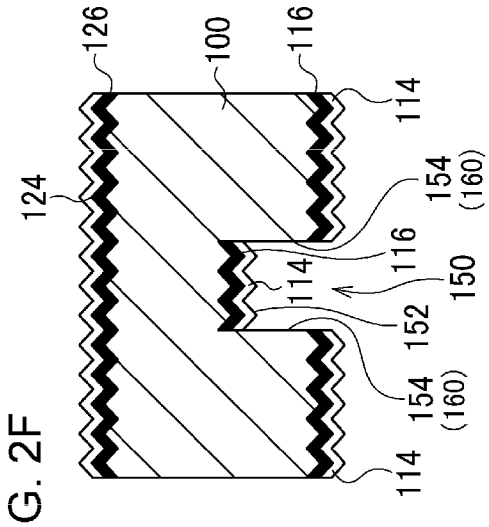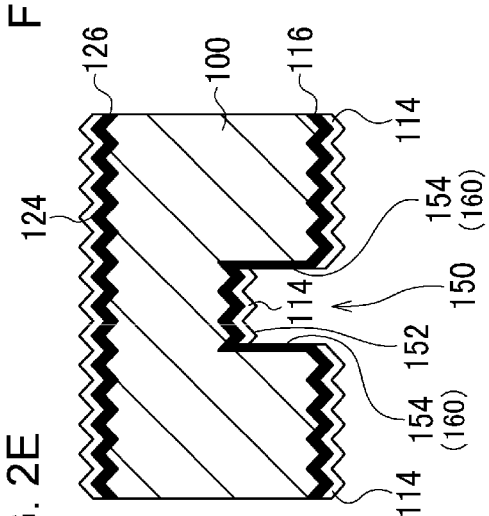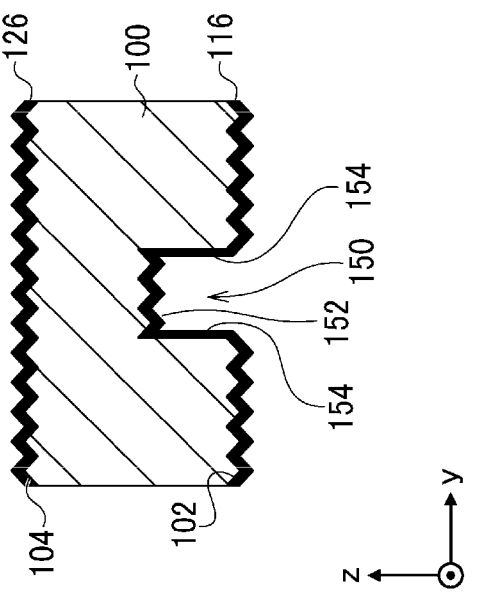

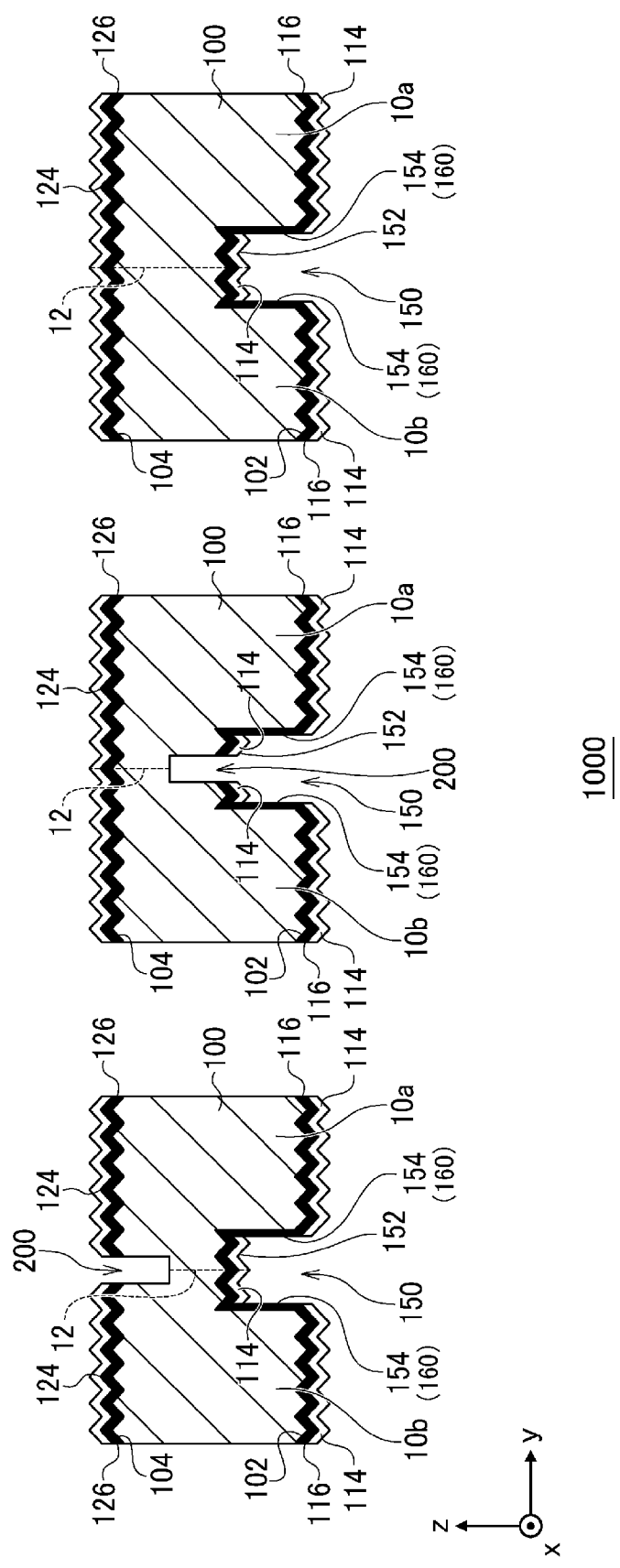

METHOD OF MANUFACTURING SOLAR CELL AND SPLITTABLE SOLAR CELL FOR MANUFACTURING SOLAR CELL FROM SPLITTABLE SOLAR CELL THAT CAN BE SPLIT

CROSS-REFERENCE TO RELATED APPLICATION

This application is based upon and claims the benefit of priority from the prior Japanese Patent Application No. 2019-061114, filed on Mar. 27, 2019, the entire contents of which are incorporated herein by reference.

BACKGROUND

1. Field

The present disclosure relates to a technology of manufacturing a solar cell, and, in particular, to a method of manufacturing a solar cell and a splittable solar cell for manufacturing a solar cell from a splittable solar cell that can be split.

2. Description of the Related Art

An insulating area is formed after depositing a semiconductor layer and a transparent electrode layer in order to prevent a short circuit from occurring in a solar cell (e.g., JP2014-239085).

By splitting a splittable solar cell, a plurality of solar cells are obtained. In this process, the impact from a damage produced in a split portion reduces the output of power generation.

SUMMARY

The disclosure addresses the above-described issue, and a general purpose thereof is to provide a technology of inhibiting reduction in the output of power generation due to splitting.

The method of manufacturing a solar cell according to an embodiment of the disclosure includes: forming a groove on a surface of a semiconductor substrate; and forming a transparent conductive film layer on the surface of the semiconductor substrate formed with the groove. A non-deposition area, where the transparent conductive film layer is not formed, is formed in at least a part of a side surface of the groove.

Another embodiment of the present disclosure relates to a splittable solar cell. The splittable solar cell includes: a semiconductor substrate; a groove provided on a surface of the semiconductor substrate; an amorphous semiconductor layer provided at least on the surface of the semiconductor substrate and on a bottom surface of the groove; and a transparent conductive film layer provided on the surface of the semiconductor substrate and the bottom surface of the groove so as to be superposed on the amorphous semiconductor layer. A non-deposition area, where the transparent conductive film layer is not formed, is formed in at least a part of a side surface of the groove.

BRIEF DESCRIPTION OF THE DRAWINGS

The figures depict one or more implementations in accordance with the present teaching, by way of example only, not by way of limitations. In the figures, like reference numerals refer to the same or similar elements.

FIGS. 2A-2F show a method of manufacturing the splittable solar cell of FIG. 1;

FIGS. 3A-3C show a method of manufacturing the solar cell; and

DETAILED DESCRIPTION

The invention will now be described by reference to the preferred embodiments. This does not intend to limit the scope of the present invention, but to exemplify the invention.

A brief summary will be given before describing the present disclosure in specific details. The embodiment relates to a technology of splitting one solar cell into a plurality of cells. The one solar cell that is yet to be split will be called a "splittable solar cell", and each of the plurality of solar cells after splitting will be called a "solar cell". In the related art, a splittable solar cell including crystalline silicon, an amorphous silicon layer, and a transparent electrode layer (TCO) is split at a groove formed by producing a slit by laser ablation or mechanical scribing. However, carries move more easily in TCO than in crystalline silicon or in the amorphous silicon layer. Therefore, splitting a splittable solar cell results in reduction in the output of power generation due to the impact from a damage at the split portion.

If an area in which TCO is not deposited (non-deposition area) is formed by using a mask or the like, on the other hand, movement of carries to a damaged split portion is inhibited, and reduction in the output of power generation is inhibited. In order to form an area in which TCO is not deposited, however, it will be necessary to build a mask when depositing TCO and removing the mask after the deposition by using an etching paste or laser. In the case of using a mask, the valid power generation area is decreased as a result of a failure to reduce the mask width and a resultant increase in the non-deposition area. Meanwhile, laser or etching paste applies a damage to the amorphous silicon layer by impacting them with heat or a chemical agent, resulting in reduction in the output of power generation.

In the embodiment, a groove is formed in the semiconductor substrate by laser ablation, blade dicing, etc. in the process of manufacturing a splittable solar cell that is a silicon heterojunction cell. By turning the semiconductor substrate formed with a groove into cells, an area in which TCO is not deposited (non-deposition area) is formed on the side surface of the groove. By further forming a groove for splitting by laser ablation or blade dicing near the non-deposition area, the splittable cell is split into a plurality of solar cells. The terms "parallel" and "orthogonal" in the following description not only encompass completely parallel or orthogonal but also encompass slightly off-parallel and off-orthogonal within the margin of error. The term "substantially" means identical within certain limits. Hereafter, (1) the manufacturing steps and (2) the structure of a solar cell module will be described in the stated order.

(1) Manufacturing Steps

Figure 1:
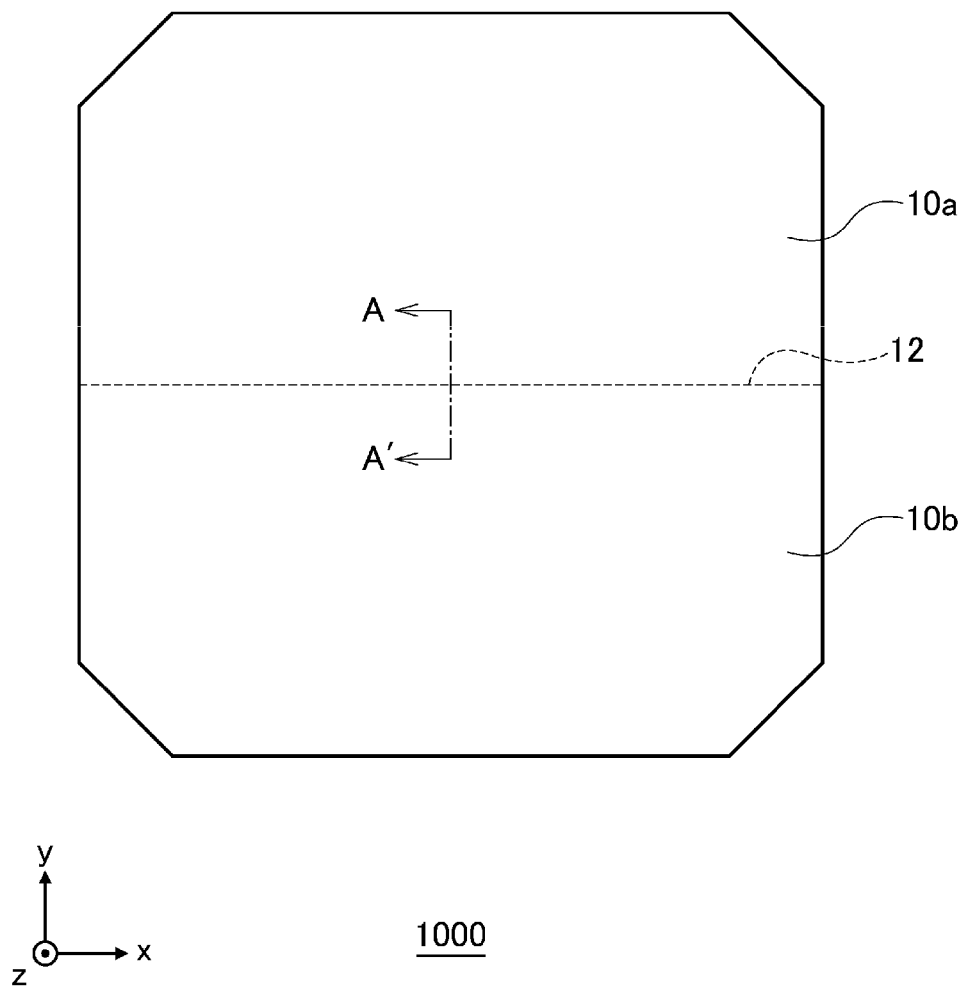
FIG. 1 is a top view showing a structure of a splittable solar cell according to an embodiment.

FIG. 1 is a top view showing a structure of a splittable solar cell 1000. As shown in FIG. 1, an orthogonal coordinate system including an x axis, y axis, and a z axis is defined. The x axis and y axis are orthogonal to each other in the plane of the splittable solar cell 1000. The z axis is perpendicular to the x axis and y axis and extends in the direction of thickness of the splittable solar cell 1000. The positive directions of the x axis, y axis, and z axis are defined in the directions of arrows in FIG. 1, and the negative directions are defined in the directions opposite to those of the arrows. Of the two principal surfaces forming the splittable solar cell 1000 that are parallel to the x-y plane, the principal surface disposed on the positive direction side along the z axis is the light receiving surface, and the principal surface disposed on the negative direction side along the z axis is the back surface. Hereinafter, the positive direction side along the z axis will be referred to as "light receiving surface side" and the negative direction side along the z axis will be referred to as "back surface side".

Therefore, FIG. 1 shows a structure of the splittable solar cell 1000 from the light receiving surface side. The splittable solar cell 1000 is shaped such that the four corners of a square are chamfered straight. A splitting line 12 extending in the x-axis direction is provided at the center of the splittable solar cell 1000 in the y-axis direction. The splitting line 12 is a line along which the splittable solar cell 1000 is expected to be split. By splitting the splittable solar cell 1000 along the splitting line 12, a first solar cell 10a and a second solar cell 10b are formed. The first solar cell 10a and the second solar cell 10b are generically referred to as solar cells 10. The solar cell 10 has a rectangular shape that is longer in the x-axis direction than in the y-axis direction. The solar cell 10 is called a half-cut cell. The shape of the splittable solar cell 1000, the arrangement of the splitting line 12, the shape and number of the solar cells 10 shown in FIG. 1 are by way of example only and may be otherwise.

FIGS. 2A-2F show a method of manufacturing the splittable solar cell 1000. These figures represent cross-sectional views of FIG. 1 in a direction along the A-A' line of FIG. 1. Referring to FIG. 2A, an n-type semiconductor substrate 100 that is an as-sliced silicon wafer is prepared. The n-type semiconductor substrate 100 is formed from a silicon substrate, a germanium substrate, etc. having a monocrystalline or polycrystalline structure and has a first surface 102 on the back surface side and a second surface 104 on the light receiving surface side. In other words, the first surface 102 and the second surface 104 face opposite directions. The first surface 102 lies in a direction in which a pn heterojunction is expected to be produced in the subsequent process.

Referring to FIG. 2B, a groove 150 is formed on the first surface 102 of the n-type semiconductor substrate 100 by blade dicing or laser ablation. The groove 150 provided on the first surface 102 includes a bottom surface 152 and a side surface 154. The bottom surface 152 is a surface substantially parallel to the first surface 102 or the second surface 104, and the side surface 154 is a surface that connects the first surface 102 and the bottom surface 152. The angle θ formed by the first surface 102 and the side surface 154 is configured to be 90 degrees or smaller. In other words, the groove 150 has a cross section having a shape of a dovetail groove. The width of the groove 150 is, for example, 0.01-2 mm, and, preferably, 0.02-1 mm, and, more preferably, 0.05-0.5 mm. The smaller the width of the groove 150, the more difficult it is to deposit TCO in the subsequent process. On the other hand, the larger the width of the groove 150, the larger the output loss. The depth of the groove 150 is, for example, 0.01-0.1 mm, and, preferably, 0.02-0.04 mm. The smaller the depth of the groove 150, the narrower the non-deposition area produced in the subsequent process. On the other hand, the larger the depth of the groove 150, the more difficult it is to deposit TCO in the subsequent process and the more likely it is that a crack occurs during the process of producing cells.

Referring to FIG. 2C, after the groove 150 is formed in the n-type semiconductor substrate 100, a texture 106 is formed by cleaning and anisotropic etching in the first surface 102 and the second surface 104 of the n-type semiconductor substrate 100 and in the groove 150. In the groove 150, in particular, the texture 106 is formed on the bottom surface 152. The reason for forming the texture 106 in the groove 150 is to enhance the effect of containing light entering the groove 150.

Referring to FIG. 2D, after the texture 106 is formed, a p-type passivation layer 116 is formed on the back surface side of the first surface 102 formed with the groove 150 by the plasma CVD (Chemical Vapor Deposition) method. In this process, the p-type passivation layer 116 is also formed on the bottom surface 152 and the side surface 154 of the groove 150. In this way, the p-type passivation layer 116 is provided on the first surface 102 of the n-type semiconductor substrate 100 and on the bottom surface 152 and the side surface 154 of the groove 150. The p-type passivation layer 116 includes an intrinsic amorphous semiconductor layer and a p-type amorphous semiconductor layer. Of these, the intrinsic amorphous semiconductor layer is provided toward the first surface 102. The intrinsic amorphous semiconductor layer and the p-type amorphous semiconductor layer are made of, for example, silicon or germanium. It can therefore be said that the p-type passivation layer 116 has a p-type semiconductor material. In other words, the groove 150 is provided on the side where the pn junction surface is formed.

Further, an n-side passivation layer 126 is formed on the light receiving surface side of the second surface 104 by the plasma CVD method. In this way, the n-side passivation layer 126 is provided on the light receiving surface side of the second surface 104 of the n-type semiconductor substrate 100. The n-side passivation layer 126 includes an intrinsic amorphous semiconductor layer and a n-type amorphous semiconductor layer. Of these, the intrinsic amorphous semiconductor layer is provided toward the second surface 104. The intrinsic amorphous semiconductor layer and the n-type amorphous semiconductor layer are also made of, for example, silicon or germanium. It can therefore be said that the n-side passivation layer 126 has an n-type semiconductor material.

Referring to FIG. 2E, a p-side transparent conductive film layer 114 is formed by the PVD (Physical Vapor Deposition) method on the back surface side of the p-type passivation layer 116 formed with the groove 150. The p-side transparent conductive film layer 114 is a translucent conductive film of ITO (Indium Tin Oxide) and corresponds to the aforementioned TCO. Generally, it is easy to conform to the shape of a target with the CVD method due to surface migration, but it is not easy to conform to the shape of a target with the PVD method. For this reason, the p-type passivation layer 116 is also formed on the bottom surface 152 and the side surface 154 of the groove 150, but the p-side transparent conductive film layer 114 is formed on the bottom surface 152 of the groove 150 and is not formed on the side surface 154. The side surface 154 on which the p-side transparent conductive film layer 114 is not formed can be said to be a non-deposition area 160 of the p-side transparent conductive film layer 114. In the non-deposition area 160, only the p-type passivation layer 116 is deposited. In other words, forming the groove 150 in the n-type semiconductor substrate 100 before forming the p-side transparent conductive film layer 114 is equivalent to forming a mask conforming to the shape of the n-type semiconductor substrate 100. The mask conforming to the shape of the n-type semiconductor substrate 100 forms the non-deposition area 160. Further, a p-side collecting electrode (not shown) is provided on the back surface side of the p-side transparent conductive film layer 114 by a printing process, etc. The p-side collecting electrode is, for example, a silver electrode.

A n-side transparent conductive film layer 124 is formed on the light receiving surface side of the n-side passivation layer 126 by the PVD method. The n-side transparent conductive film layer 124 is also a transparent conductive film of ITO, etc. and corresponds to the aforementioned TCO. Further, an n-side collecting electrode (not shown) is provided on the light receiving surface side of the n-side transparent conductive film layer 124 by a printing process, etc. The n-side collecting electrode is, for example, a silver electrode. The thickness of the p-side transparent conductive film layer 114 or the n-side transparent conductive film layer 124 is, for example, 1 nm-1 μm, and, preferably, 50 nm-150 nm. The thickness of the n-type semiconductor substrate 100 is, for example, 50 μm-500 μm, and, preferably, 100 μm-200 μm.

If the groove 150 formed in FIG. 2B is narrow or deep, the structure of the splittable solar cell 1000 will be as shown in FIG. 2F instead of FIG. 2E. As shown in the figure, the p-type passivation layer 116 is not formed on the side surface 154 of the groove 150. Therefore, the p-side transparent conductive film layer 114 and the p-type passivation layer 116 are not provided in the non-deposition area 160.

The process of splitting the splittable solar cell 1000 will be described below on an assumption that the splittable solar cell 1000 has the structure of FIG. 2E. FIGS. 3A-3C show a method of manufacturing the solar cell 10. Splitting is performed as shown in one of FIGS. 3A-3C. Referring to FIG. 3A, a groove for splitting 200 is formed on side of the second surface 104 of the splittable solar cell 1000 by blade dicing or laser ablation after the n-side colleting electrode and the p-side collecting electrode are formed. Dicing is formed from the surface opposite to the surface on which the groove 150 is provided so that the side surface 154 is not damaged even if misalignment occurs. The width of the groove for splitting 200 is, for example, 0.001-1 mm, and, preferably, 0.001-0.5 mm, and, more preferably, 0.001-0.1 mm. In particular, the width of the groove for splitting 200 is configured to be smaller than the width of the groove 150. The smaller the width of the groove for splitting 200, the less the appearance is impaired. Meanwhile, the larger the width of the groove for splitting 200, the larger the output loss. Therefore, the smaller the width of the groove for splitting 200, the better.

The depth of the groove for splitting 200 is, for example, 0.01-0.1 mm, and, preferably, 0.02-0.04 mm. The larger the depth of the groove for splitting 200, the easier it is to split the cell. An appropriate depth may be achieved by increasing the number of scanning. The total of the depth of the groove 150 and that of the groove for splitting 200 is configured to be 40%-80%, and, preferably, 50%-70%, of the entire thickness of the n-type semiconductor substrate 100. Further, by cutting the splittable solar cell 1000 along the splitting line 12 included in the groove for splitting 200, the first solar cell 10a and the second solar cell 10b are manufactured.

Referring to FIG. 3B, the groove for splitting 200 is formed on the bottom surface 152 of the groove 150 by blade dicing or laser ablation after the n-side colleting electrode and the p-side collecting electrode are formed. Dicing is formed in the groove 150 so that the appearance on the light receiving surface is maintained. The size of the groove for splitting 200 may be equal to that of FIG. 3A. By cutting the splittable solar cell 1000 along the splitting line 12 included in the groove for splitting 200, the first solar cell 10a and the second solar cell 10b are manufactured.

Referring to FIG. 3C, after the n-side collecting electrode and the p-side collecting electrode are formed, the splittable solar cell 1000 is split along the splitting line 12 by TLS (Thermal Laser Separation), and the first solar cell 10a and the second solar cell 10b are manufactured accordingly.

(2) Structure of a Solar Cell Module

Figure 4A:
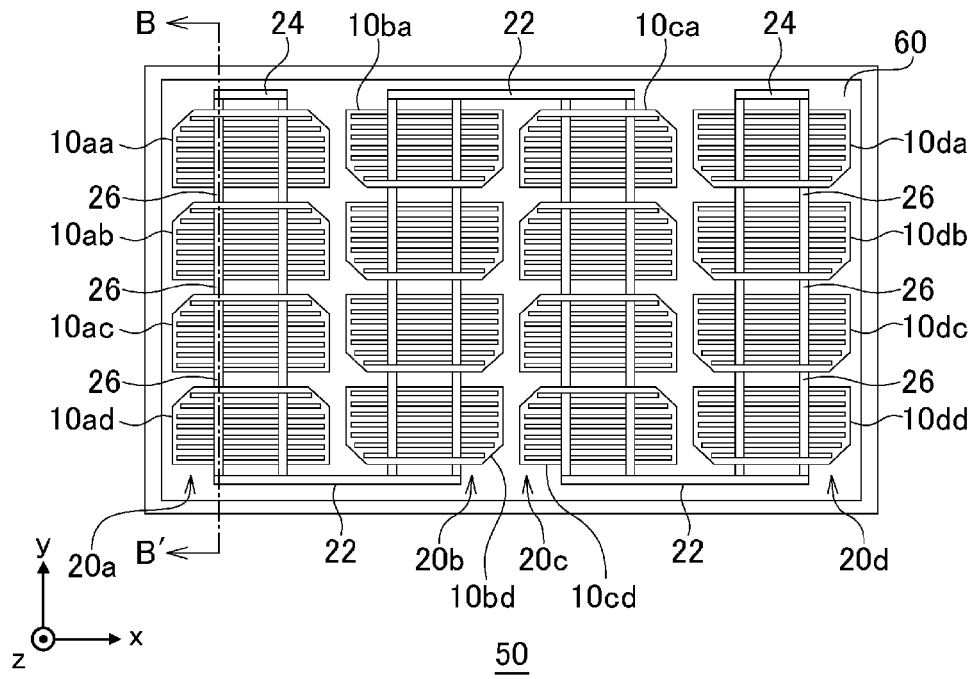
FIGS. 4A-4C show a structure of a solar cell module including the solar cell of FIG. 1.
Figure 4B:
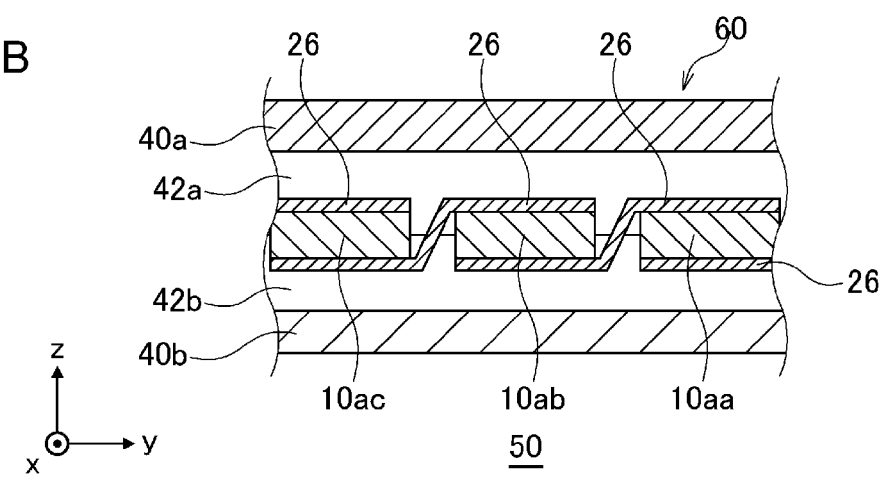
Figure 4C:
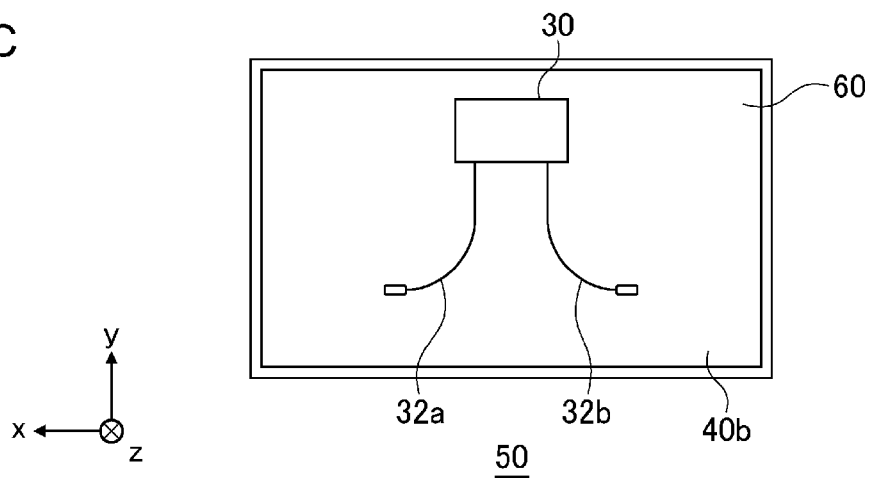

FIGS. 4A-4C show a structure of a solar cell module 50 including the solar cell 10. FIG. 4A is a plan view of the solar cell module 50 as viewed from the light receiving surface side. A frame is attached to the solar cell module 50 so as to surround a solar cell panel 60. The solar cell panel 60 includes an 11th solar cell 10aa, . . . , a 44th solar cell 10dd, which are generically referred to as solar cells 10, inter-string wiring members 22, string-end wiring members 24, and inter-cell wiring members 26.

Each solar cell 10 is produced by splitting the splittable solar cell 1000 described so far. A plurality of finger electrodes extending in the x axis direction in a mutually parallel manner and a plurality of (e.g., two) bus bar electrodes extending in the y axis direction to be orthogonal to the plurality of finger electrodes are disposed on the light receiving surface and the back surface of each solar cell 10. The bus bar electrodes connect the plurality of finger electrodes to each other. The bus bar electrode and the finger electrode correspond to the p-side collecting electrode and the n-side collecting electrode described above.

The plurality of solar cells 10 are arranged in a matrix on the x-y plane. By way of example, four solar cells 10 are arranged in the x axis direction and four solar cells are arranged in the y axis direction. The number of solar cells 10 arranged in the x axis direction and the number of solar cells 10 arranged in the y axis direction are not limited to the examples above. The four solar cells 10 arranged and disposed in the y axis direction are connected in series by the inter-cell wiring member 26 so as to form one solar cell string 20. For example, by connecting the 11th solar cell 10aa, a 12th solar cell 10ab, a 13th solar cell 10ac, and a 14th solar cell 10ad, a first solar cell string 20a is formed. The other solar cell strings 20 (e.g., a second solar cell string 20b through a fourth solar cell string 20d) are similarly formed. As a result, the four solar cell strings 20 are arranged in parallel in the x axis direction.

In order to form the solar cell strings 20, the inter-cell wiring members 26 connect the bus bar electrode on the light receiving surface side of one of adjacent solar cells 10 to the bus bar electrode on the back surface side of the other solar cell 10. For example, the two inter-cell wiring members 26 for connecting the 11th solar cell 10aa and the 12th solar cell 10ab electrically connect the bus bar electrode on the light receiving surface side of the 11th solar cell 10aa and the bus bar electrode on the back surface side of the 12th solar cell 10ab.

Each of the plurality of inter-string wiring members 22 extends in the x axis direction and is electrically connected to two adjacent solar cell strings 20. For example, the inter-string wiring member 22 disposed farther on the positive direction side along the y axis than the plurality of solar cells 10 connects the 21st solar cell 10ba in the second solar cell string 20b and the 31st solar cell 10ca in the third solar cell string 20c. The same is also true of the other inter-string wiring members 22. As a result, the plurality of solar cell strings 20 are connected in series. The string-end wiring member 24 is connected to the solar cells 10 (e.g., the 11th solar cell 10aa and the 41st solar cell 10da) at the ends of the plurality of solar cell strings 20 connected in series. The string-end wiring member 24 is connected to a terminal box (not shown).

FIG. 4B is a cross-sectional view of the solar cell module 50 and is a B-B cross-sectional view of FIG. 4A. The solar cell panel 60 in the solar cell module 50 includes the 11th solar cell 10aa, the 12th solar cell 10ab, the 13th solar cell 10ac, which are generically referred to as solar cells 10, the inter-cell wiring member 26, a first protective member 40a, a second protective member 40b, which are generically referred to as protective members 40, a first encapsulant 42a, a second encapsulant 42b, which are generically referred to as encapsulants 42. The top of FIG. 4A corresponds to the light receiving surface side, and the bottom corresponds to the back surface side.

The first protective member 40a is disposed on the light receiving surface side of the solar cell panel 60 and protects the surface of the solar cell panel 60. The first protective member 40a is formed by using a translucent and water shielding glass, translucent plastic, etc. and is formed in a rectangular shape. In this case, it is assumed that glass is used. The first encapsulant 42a is stacked on the back surface of the first protective member 40a. The first encapsulant 42a is disposed between the first protective member 40a and the solar cell 10 and adhesively bonds the first protective member 40a and the solar cell 10. For example, a thermoplastic resin film of polyolefin, EVA, polyvinyl butyral (PVB), polyimide, or the like may be used as the first encapsulant 42a. A thermosetting resin may alternatively be used. The first encapsulant 42a is formed by a translucent, rectangular sheet member having a surface of substantially the same dimension as the x-y plane in the first protective member 40a.

The second encapsulant 42b is stacked on the back surface side of the first encapsulant 42a. The second encapsulant 42b encapsulates the plurality of solar cells 10, the inter-cell wiring members 26, etc. between the second encapsulant 42b and the first encapsulant 42a. The second encapsulant 42b may be made of a material similar to that of the first encapsulant 42a. Alternatively, the second encapsulant 42b may be integrated with the first encapsulant 42a by heating the members in a laminate cure process.

The second protective member 40b is stacked on the back surface side of the second encapsulant 42b. The second protective member 40b protects the back surface side of the solar cell panel 60 as a back sheet. A resin (e.g., PET) film is used for the second protective member 40b. A stack film having a structure in which an Al foil is sandwiched by resin films, or the like is used as the second protective member 40b.

FIG. 4C is a plan view of the solar cell module 50 as viewed from the back surface side. A box-shaped terminal box 30 is attached to the solar cell panel 60 in the solar cell module 50. A first cable 32a and a second cable 32b are electrically connected to the terminal box 30. The first cable 32a and the second cable 32b output the electric power generated in the solar cell module 50 outside.

According to the embodiment, the p-side transparent conductive film layer 114 is deposited after the groove 150 is formed in the n-type semiconductor substrate 100 so that the masking effect is provided by the shape of the n-type semiconductor substrate 100. Further, since the masking effect is provided by the shape of the n-type semiconductor substrate 100, the non-deposition area 160 can be formed. Further, the non-deposition area 160 is formed at least in a part of the side surface 154 so that reduction in the output of generation power due to splitting is inhibited. Further, the p-side transparent conductive film layer 114 is also formed on the bottom surface 152 of the groove 150 so that reduction in the area of the p-side transparent conductive film layer 114 is inhibited.

Further, since the p-type passivation layer 116 is formed on the first surface 102 and the bottom surface 152 of the groove 150, the passivation layer is secured. Further, the p-type passivation layer 116 is also formed on the side surface 154 so that the passivation layer is secured. Further, the texture 106 is formed on the first surface 102 of the n-type semiconductor substrate 100 and on the groove 150 so that the light entering the solar cell 10 is used efficiently. Further, since the light entering the solar cell 10 is used efficiently, the power generation efficiency is improved. Further, the texture 106 is formed in the groove 150 so that the effect of confining light is enhanced. Further, since the effect of confining light is enhanced, the output is improved.

Further, the cell is split along the groove for splitting 200 formed on the bottom surface 152 of the groove 150 so that the groove for splitting 200 is made invisible from the light receiving surface. Further, since the groove for splitting 200 is made invisible from the light receiving surface, the cell can be split so as not to impair the appearance on the light receiving surface. Further, the groove 150 is worked to produce the groove for splitting 200 so that the precision of processing is improved. The cell is split along the groove for splitting 200 formed in the second surface 104 in the n-type semiconductor substrate 100 facing in a direction opposite to that of the first surface 102 so that the damage to the side surface 154 is inhibited. Further, the groove for splitting 200 is provided on the light receiving surface side so that a large distance is ensured between the groove for splitting 200 and the portion of pn junction. Further, since the distance between the groove for splitting 200 and the portion of pn junction is long, the impact from work is reduced.

A summary of the embodiment is given below. A method of manufacturing a solar cell 10 according to an embodiment of the disclosure includes: forming a groove 150 on a first surface 102 of an n-type semiconductor substrate 100; and forming a p-side transparent conductive film layer 114 on the first surface 102 of the n-type semiconductor substrate 100 formed with the groove 150. A non-deposition area 160, where the p-side transparent conductive film layer 114 is not formed, is formed in at least a part of a side surface 154 of the groove 150.

The transparent conductive film layer is also formed on a bottom surface 152 of the groove 150.

The method may further include: forming a p-type passivation layer 116 on the first surface 102 of the n-type semiconductor substrate 100 formed with the groove 150 before forming the p-side transparent conductive film layer 114. The p-type passivation layer 116 is also formed on the bottom surface 152 of the groove 150.

The p-type passivation layer 116 is also formed in at least a part of the side surface 154 of the groove 150.

The method further includes forming a texture 106 on the first surface 102 of the n-type semiconductor substrate 100 and on the groove 150 before forming the p-type passivation layer 116.

The method further includes: forming a groove for splitting 200 on the bottom surface 152 of the groove 150; and splitting the solar cell along the groove for splitting 200.

The method further includes: forming the groove for splitting 200 on a second surface 104 in the n-type semiconductor substrate 100 facing a direction opposite to that of the first surface 102; and splitting the cell along the groove for splitting 200.

Another embodiment of the present disclosure relates to a splittable solar cell 1000. The splittable solar cell 1000 includes: an n-type semiconductor substrate 100; a groove 150 provided on the first surface 102 of the n-type semiconductor substrate 100; a p-type passivation layer 116 provided at least on the first surface 102 of the n-type semiconductor substrate 100 and on the bottom surface 152 of the groove 150; and a p-side transparent conductive film layer 114 provided on the first surface 102 of the n-type semiconductor substrate 100 and the bottom surface 152 of the groove 150 so as to be superposed on the p-type passivation layer 116. The non-deposition area 160, where the p-side transparent conductive film layer 114 is not formed, is formed in at least a part of the side surface 154 of the groove 150.

The p-type passivation layer 116 is also formed in at least a part of the side surface 154 of the groove 150.

The n-type semiconductor substrate 100 has a texture structure on the bottom surface 152 of the groove 150.

Described above is an explanation based on an exemplary embodiment. The embodiment is intended to be illustrative only and it will be understood by those skilled in the art that various modifications to constituting elements and processes could be developed and that such modifications are also within the scope of the present disclosure.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A method of manufacturing a solar cell comprising:
    forming a first groove in a first surface of a semiconductor substrate, the first groove including a first side surface, a second side surface facing the first side surface, and a bottom surface between the first side surface and the second side surface;
    forming an amorphous semiconductor layer on the first surface, the first side surface, the second side surface, and the bottom surface; and
    forming a transparent conductive film layer on the first surface and the bottom surface, on which the amorphous semiconductor layer is formed,
    wherein the first side surface and the second side surface are non-deposition areas on which the transparent conductive film layer is not formed, and
    wherein the first side surface and the second side surface, on which the amorphous semiconductor layer is formed, and the bottom surface, on which the amorphous semiconductor layer and the transparent conductive layer are formed, are exposed from the first surface of the semiconductor substrate.

2. The method of manufacturing a solar cell according to claim 1, further comprising:
    forming a texture on the first surface and the bottom surface before forming the amorphous semiconductor layer, wherein
    the texture is not formed on the first side surface and the second side surface.

3. The method of manufacturing a solar cell according to claim 1, further comprising:
    forming a second groove for splitting on the bottom surface of the first groove; and
    splitting the solar cell along the second groove for splitting.

4. The method of manufacturing a solar cell according to claim 1, further comprising:
    forming a second groove for splitting in a second surface of the semiconductor substrate facing a direction opposite to that of the first surface; and
    splitting the cell along the second groove for splitting.

5. The method of manufacturing a solar cell according to claim 1, further comprising: splitting the solar cell along the first groove.

* * * * *